(12) United States Patent
Sekigawa et al.

(10) Patent No.: US 6,989,706 B2
(45) Date of Patent: Jan. 24, 2006

(54) METHOD FOR APPLICATION OF GATING SIGNAL IN INSULATED DOUBLE GATE FET

(75) Inventors: Toshihiro Sekigawa, Tsukuba (JP); Hanpei Koike, Tsukuba (JP); Tadashi Nakagawa, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 10/808,432

(22) Filed: Mar. 25, 2004

(65) Prior Publication Data

US 2004/0189373 A1 Sep. 30, 2004

(30) Foreign Application Priority Data

Mar. 27, 2003 (JP) .............................. 2003-087386

(51) Int. Cl.
*H03K 17/687* (2006.01)

(52) U.S. Cl. ...................................................... 327/434
(58) Field of Classification Search ................ 327/333, 327/427, 429, 434, 437; 326/63, 68, 80–81

See application file for complete search history.

(56) References Cited

U.S. PATENT DOCUMENTS

| 4,275,361 A | * | 6/1981 | Schurmann | .................. 330/277 |
| 4,564,816 A | * | 1/1986 | Kumar et al. | ................ 330/149 |
| 4,611,184 A | * | 9/1986 | Kumar | ........................ 333/100 |
| 5,689,144 A | * | 11/1997 | Williams | .................... 307/130 |
| 6,580,293 B1 | * | 6/2003 | Bernstein et al. | ............. 326/95 |

FOREIGN PATENT DOCUMENTS

| FR | 2571188 A1 | * | 4/1986 |
| JP | 7-50785 | | 5/1995 |

\* cited by examiner

*Primary Examiner*—My-Trang Nu Ton
(74) *Attorney, Agent, or Firm*—Oblon, Spivak, McClelland, Maier & Neustadt, P.C.

(57) ABSTRACT

In an insulated double gate FET, the threshold voltage during the operation of a transient response thereof is enabled to be arbitrarily and accurately controlled by a method that includes applying a first input signal intended to perform an ordinary logic operation to one of the gate electrodes thereof and applying, in response to this signal, a second signal that has a signal-level temporal-change direction as the first input signal and has at least one of the low level and the high level thereof shifted by a predetermined magnitude or endowed with a predetermined time difference or has the time slower or faster signal level change of the signal to the other gate electrode.

4 Claims, 8 Drawing Sheets

(a)

(b)

(c)

(d)

F I G. 4
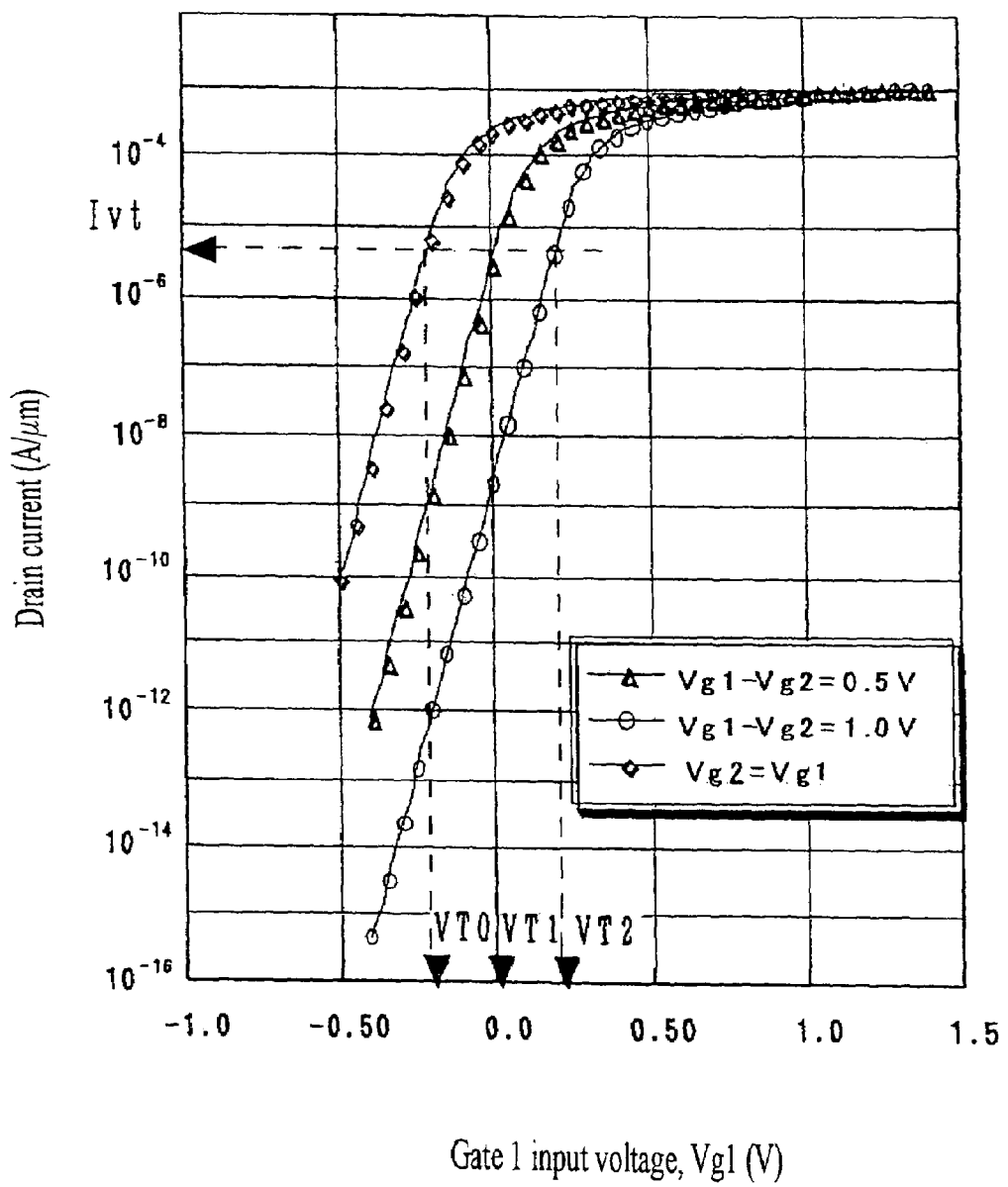

F I G. 12
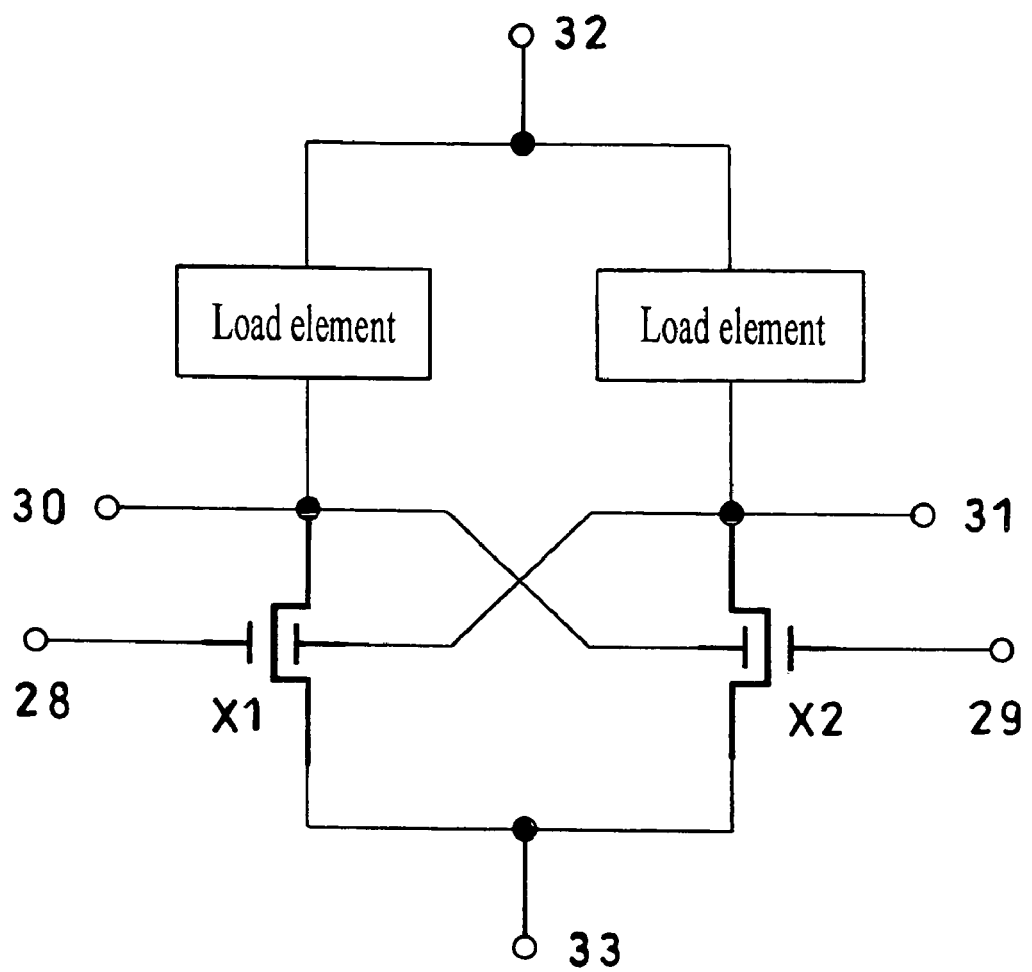

METHOD FOR APPLICATION OF GATING SIGNAL IN INSULATED DOUBLE GATE FET

BACKGROUND OF THE INVENTION

1. Field of the Invention

This invention relates to a method for the application of a gating signal in an insulated double gate field effect transistor (FET).

2. Description of the Prior Art

For the purpose of materializing an insulated gate FET having a minute channel length, the prevention of the so-called short channel effect (sudden fall of threshold voltage occurring when the channel length is shortened) is an indispensable condition.

As one of the element configurations directed toward this prevention, an insulated double gate FET illustrated in FIG. 1 may be adduced, for example (Japanese Patent No. 2021931). In the diagram, 1 denotes a substrate, 2 a second gate insulating film concurrently serving as an insulating layer for separating a semiconductor crystal layer formed on the substrate from the substrate, though not wholly illustrated, 3, 4 and 5 respectively a source region, a drain region and a channel region formed in part of the semiconductor crystal layer, 6 a first gate insulating film, 7 an insulating film, 8 a source electrode, 9 a drain electrode, 10 a first gate electrode, and 11 a second gate electrode.

This configuration, as a means to suppress the short channel effect, is said to be most effective. Specifically, it is claimed to prevent the threshold voltage from a sudden fall by shielding the channel region 5 with the first gate electrode 10 and the second gate electrode 11, i.e. an upper one and a lower one in a vertical pair, thereby suppressing the influence inflicted by the drain electric field on the potential distribution in the interface between the source and channel regions and consequently shortening the channel length and enabling the potential distribution in the interface between the source and channel regions to be stably controlled solely by the gate electrode.

How the threshold voltage is controlled constitutes an important point, namely the problem that confronts the element of this sort. Though this control is generally executed by controlling the concentration of the impurity in the channel region, the concentration of this impurity that is completely managed by the control has its upper limit set at a level in the neighborhood of $10^{18}$ cm$^{-3}$ owing to the restriction to the breakdown of the semiconductor itself. When the element is minutely diminished in this case, the number of the impurity atoms within the channel region decreases so extremely that the statistic change in the number of impurity atoms between individual elements comes to manifest itself conspicuously as the change in the threshold voltage. This point brings up the problem of decline in yield to an integrated circuit that uses an extremely large number of elements.

The insulated double gate FET can avoid this problem because it is capable of using a channel region of an extremely low concentration approximating an intrinsic semiconductor without impairing the restriction of the short channel effect. For the purpose of realizing a right threshold voltage, it is inevitable to use a metal possessing an appropriate work function as the material for the gate electrode. The metal, however, allows of no fine control of the work function because the work function has a discrete value for metal to metal. A method that attempts to produce a material manifesting a proper work function by using SiGe, for example, and properly selecting the ratio of Si and Ge has been proposed. This method, however, is at a disadvantage in complicating the process to be used for the production.

The preceding description has depicted the insulated double gate FET as having the two gates thereof electrically connected to each other. There has been known a method which comprises using one of the gate electrodes for signal input and applying to the other gate electrode a stated constant potential (though the magnitude of the constant potential varies at any time, there are times when the potential may be retained at least at a fixed magnitude during a period amply longer than the cycle of input signal) as illustrated in FIG. 2(d), thereby controlling the threshold voltage seen from the signal input gate at the optimum magnitude. Since the electric current flows only through the channel on the signal input gate side, this method is at a disadvantage in suffering the amount of electric current to be roughly halved from the amount obtained when the two gate electrodes are electrically connected and inducing a degradation of the load driving ability during the operation of transient response. It is further at a disadvantage in widening the so-called gate swing (otherwise called "S factor" and reported in the denomination of "mV/digit") so much as to pose an awful question as to how much change in gate voltage is necessary for shifting the drain current by one order of magnitude below the threshold voltage. Incidentally, when the two gate electrodes are electrically connected, such a small magnitude at room temperature as about 60 mV/decade that substantially approximates the theoretical limit is realized.

This invention is directed toward providing a method for applying a gating signal in an insulated double gate FET that eliminates the drawbacks mentioned above and enables the threshold voltage to be arbitrarily controlled with high accuracy.

SUMMARY IF THE INVENTION

The method according to this invention for the application of a gating signal in an insulated double gate FET comprises applying, in response to a first signal fed into a first gate electrode of the insulated double gate FET, to a second gate electrode a second signal that has a temporal change of a signal level in a same direction as the first signal and (i) has a signal level shifted by a predetermined magnitude or (ii) has a slower or faster rise time or a fall time or (iii) has admitted a predetermined time difference.

This invention further embraces an integrated circuit that possesses an insulated double gate FET using the aforementioned method for applying a gating signal.

This invention, as described above, consists in enabling the threshold voltage of an insulated double gate FET to be controlled arbitrarily with high accuracy by applying, in response to a first signal fed into a first gate electrode of the insulated double gate FET, to a second gate electrode a second signal which has a same direction of temporal change as the first signal and (i) has a signal level shifted by a predetermined magnitude or (ii) has a rise time or a fall time advanced or delayed or (iii) has admitted a predetermined time difference.

BRIEF EXPLANATION OF THE DRAWING

FIG. 2(d) depicts a waveform of a constant potential in accordance with the conventional method for controlling the threshold voltage.

FIG. 4 is a gate characteristic diagram of an insulated double gate FET determined by the method of this invention for applying a gate input.

FIG. 12 is an explanatory diagram illustrating the method of this invention for the application of a third gate input as utilized in the inverter circuit of a double rail logical circuit.

DESCRIPTION OF THE PREFERRED EMBODIMENT

The method for the application of a gating signal in an insulated double gate FET according to this invention comprises applying an input signal for ordinary logical operation to one of the gate electrodes of the insulated double gate FET during the operation of transient response and applying to the other gate electrode a signal having a temporal change of a signal level in one and the same direction as the signal first mentioned above (hereinafter referred to "in-phase"), which (i) has at least one of the low level and the high level of the signal shifted by a predetermined magnitude or (ii) has the slower or faster signal level change or (iii) has admitted a predetermined time difference (advance or delay).

Figure 1:
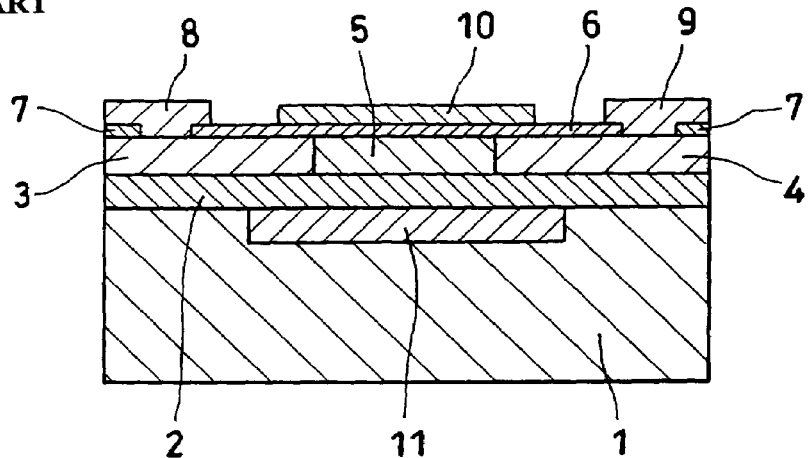
FIG. 1 is a cross section illustrating one example of the conventional insulated double gate FET.
Figure 2:
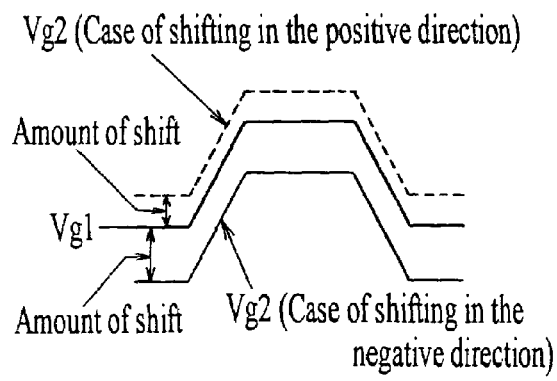
FIG. 2 illustrates waveforms of input signals to the gate electrodes and, as input signals Vg2 to the second electrode in response to input signals Vg1 to the first electrode, FIG. 2(a) depicting waveforms shifted to the negative side or the positive side, FIG. 2(b) depicting a waveform having both rise and fall delayed or advanced, FIG. 2(c) depicting a waveform delayed or advanced.
Figure 2:
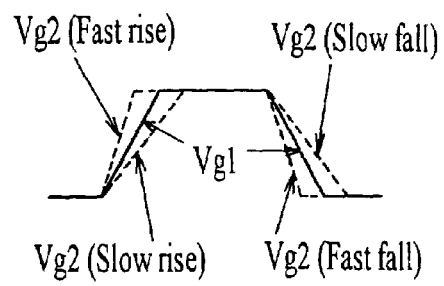
Figure 2:
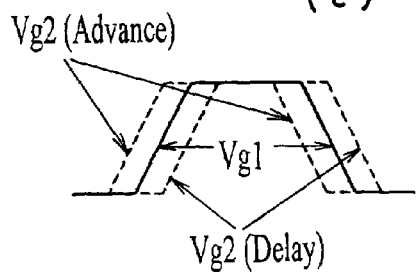
Figure 2:
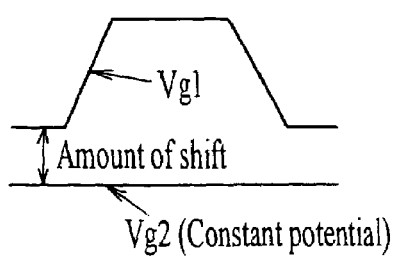

FIG. 2 schematically explains the temporal relation between the waveform of an input signal Vg1 to a gate electrode 1 and the waveform of an input signal Vg2 to a gate electrode 2. FIG. 2(a) illustrates the first method of this invention that uses the input signal Vg1 shifted to the negative side or the positive side as the signal Vg2. FIG. 2(b) illustrates the second method of this invention that uses as the Vg2 either a waveform having slower rise and fall or a waveform having faster rise and fall than the Vg1. As circumstances require, the performance of a circuit may be improved by using either a waveform having an advanced rise and a retarded fall or a waveform having a rise and a fall in respectively reversed states and decreasing the threshold voltage during the rise and increasing the threshold voltage during the fall or reversing the temporal order of the decrease and the increase. FIG. 2(c) illustrates the third method of this invention that uses as the Vg2 a waveform having the Vg1 either delayed or advanced. Then, FIG. 2(d) illustrates a case of conferring a constant potential on the Vg2 as an embodiment of the conventional method for controlling the threshold voltage.

The case of the n-type FET will be explained below by way of illustration. As usual, an input signal Vg1 is applied to one of the gate electrodes of an insulated double gate FET (the first gate, for example), and a voltage lower than the threshold voltage VT0 which exists when the two gate electrodes are mutually connected and operated, such as a constant voltage Vg2 that is −0.5 V or −1.0 V, for example, is applied at the same time to the other gate electrode (the second gate electrode, for example).

Figure 3:
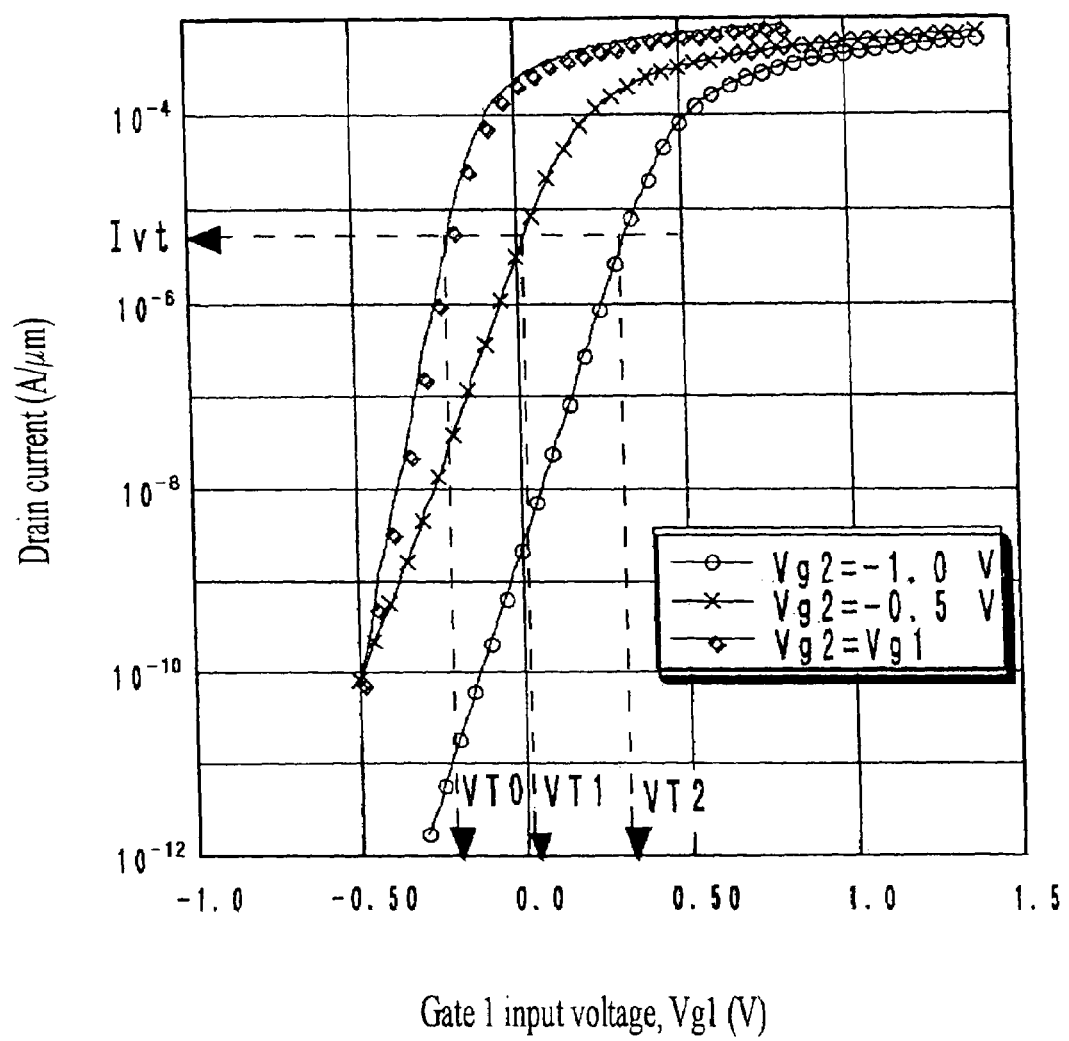
FIG. 3 is a gate characteristic diagram of an insulated double gate FET determined by the conventional method for applying a gate input.

Consequently, as illustrated in FIG. 3, both the threshold voltages can be shifted in the positive direction respectively to VT1 and VT2 in contrast to the case of connecting both the gates and applying an input signal thereto (Vg2=Vg1).

The case of applying the constant voltage Vg2, however, reveals the disadvantage of decreasing the inclination of the characteristic curve and increasing the gate swing within a voltage lower than the threshold voltage as seen in FIG. 3. The symbol Ivt denotes the magnitude of drain current which defines the threshold voltage. These characteristics have been computed by using a two-dimensional device simulator (made by SILVACO International Inc. and sold under the trademark designation of "Atlas") under the conditions of 100 nm in gate length, 2 nm in thickness of the oxide film on the first and second gates, 5 nm in thickness of the silicon channel layer, and use of aluminum gate electrodes for the first and second gate electrodes. This fact similarly applies to the following characteristic diagrams. Incidentally, the VT0 in this case is about −0.2 V.

In contrast, in the first method of this invention, an input signal Vg1 is applied to one of the gate electrodes of the insulated double gate FET (the first gate electrode, for example), and an input signal Vg2 resulting from shifting at least the low level of the Vg1 by a lower voltage than the threshold voltage VT0 existing when the two gate electrodes are mutually connected and operated, such as −0.5 V (Vg1−Vg2=0.5 V) or −1.0 V (Vg1−Vg2=1.0 V), for example, is applied at the same time to the other gate electrode (the second gate electrode, for example), as shown in FIG. 2(a).

Consequently, the threshold voltages as seen from the first gate electrode can be shifted respectively in the positive directions toward the larger magnitudes, depending on the levels of shift, to obtain the threshold voltages of VT1 and VT2 in contrast to the case of electrically connecting both the gates and applying input signals (Vg2=Vg1) as shown in FIG. 4.

In this case, both the gates acquire substantially equal amplitudes as shown in FIG. 4 without entailing such a heavy deterioration as experienced in the case of applying only a constant potential. Incidentally, in the case of FIG. 4, the signal amplitude of Vg2 is depicted to equal to that of Vg1. While the horizontal axis is indicated as the scale of the gate voltage Vg1, it may be given a different reading as "the time axis" because it is common to all transistors that the time response in the transistor is satisfactorily fast relative to the input signal.

In this case, therefore, since the time response of the rise of signal and the time response of the fall of signal are shown in the diagram to follow the same curve, the magnitudes of the threshold voltages at both the time responses are fundamentally identical. Further, by applying the input signal Vg2 that results from level-shifting the VT0 in the positive direction at the same time to the second gate electrode, it is made possible to shift the threshold voltage reverse in the negative direction. The leak current at the low level, however, increases slightly.

The second method of this invention consists in the faster or slower rise time (a time to change a signal level from low levels to high levels) signal Vg2 applied to the second gate electrode from that of the input signal Vg1 applied to the first gate electrode as shown in FIG. 2(b).

In the former case, the gate amplitude as seen from the first gate electrode apparently decreases from the theoretical value, and the threshold voltage shifts in the negative direction. In the latter case, though the gate amplitude increases, it can realize a smaller value than in the conventional case of conferring a constant potential on the second gate electrode, and the threshold voltage can be shifted in the positive direction. In the case of the fall time, though the gate swing brings the same results, the threshold voltage can be made to generate a reverse action and produce a reverse effect.

Consequently, the threshold voltage appears to differ during the rise time and during the fall time, indicating the occurrence of the property of hysteresis. The method for generating a signal of fast fall time and rise time can generate a signal faster than the input signal by the use of a trigger circuit, for example. An integrating circuit, for example, is available as a means to retard the signal.

The third method of this invention consists in applying to the second gate electrode the signal applied to the first gate electrode as appended by a predetermined delay as shown in FIG. 2(c).

Consequently, in the case of the rise time response, the constant voltage that in the present case is the voltage identical with the low level is applied to the second gate during the delay time. After the lapse of this time, the signal that has the level shifted in the negative direction by the difference in the equivalent voltage that has occurred between the two signal during the delay time is applied to the second gate electrode.

Conversely, in the case of the fall time response, since the voltage identical with the high level is applied during the relay time, the signal having the level shifted reverse in the positive direction comes to be applied to the second gate electrode.

Figure 5:
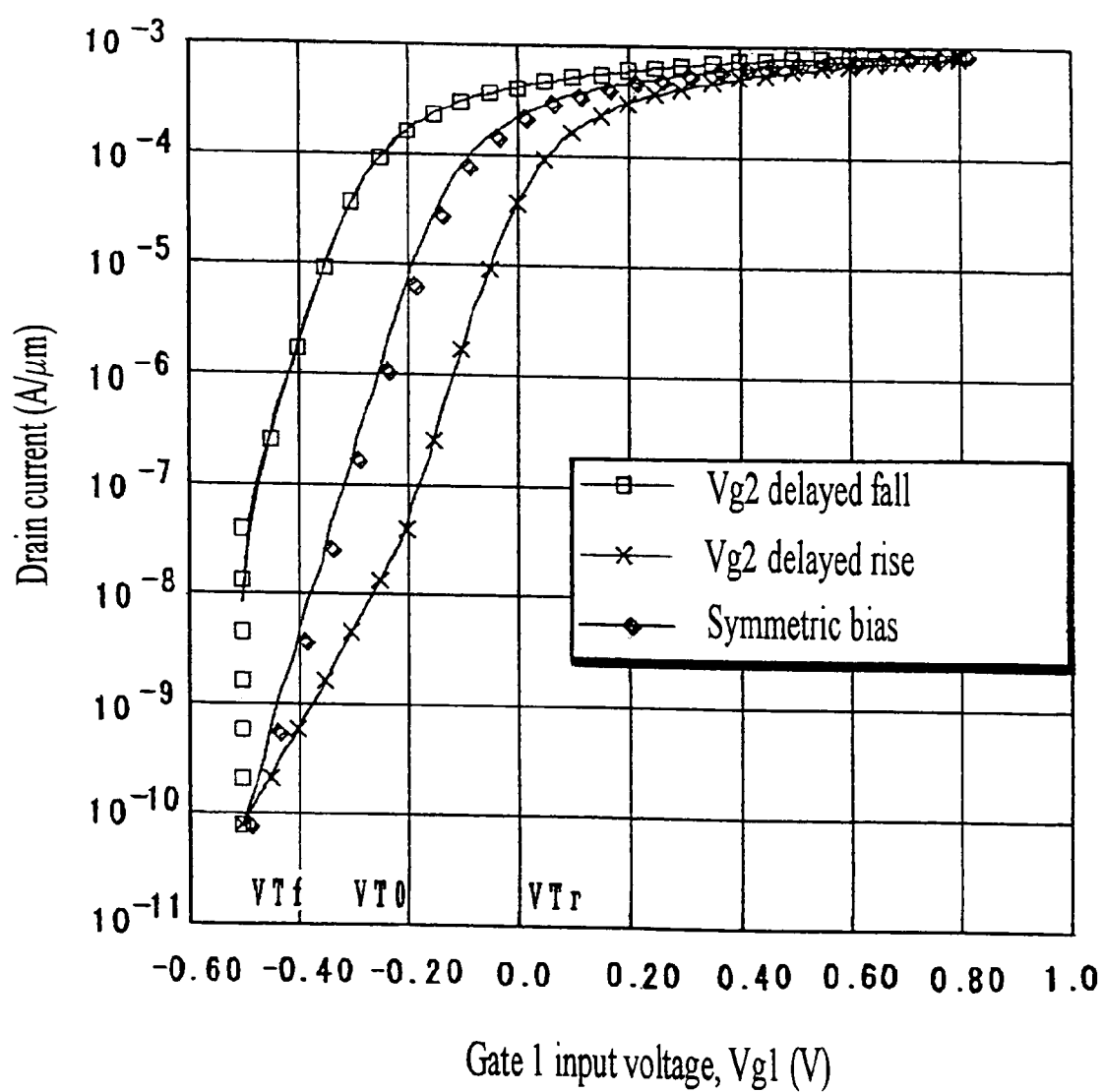
FIG. 5 is a gate characteristic diagram of an insulated double gate FET determined by a method for applying a gating input when a delayed signal of this invention is applied.

As a result, the same current response as in the case of applying the constant voltage to the second gate electrode exists during the delay portion of the rise time as shown in FIG. 5. After the elapse of this rise time, the response which shuns the deterioration of the gate swing as in the case of applying at the same time a signal level-shifted in the negative direction and which has the threshold voltage shifted in the positive direction is produced.

At the fall time, the response that has the threshold voltage shifted reverse in the negative direction and which similarly shuns the deterioration of the gate amplitude is produced. In this case, the drain current is lowered when the low level (−0.5 V) is reached because the second gate voltage is delayed in reaching the low level.

The present method reveals the property of hysteresis which causes the threshold voltage to increase during the rise time and decrease during the fall time and, therefore, allows a generous allowance for noise as compared with the case of feeding an identical signal to the first and second gate electrodes and, in the stationary state, such deteriorations as the on current and the low-level leak current are avoided because one and the same voltage is applied to both the gate electrodes.

The preceding explanation of this invention has depicted the oxide film of the second gate as having the same thickness as the oxide film of the first gate. Even when the oxide film of the second gate is given a larger thickness than the oxide film of the first gate, for example, the function and the effect of the invention described above are similarly produced.

In this case, the threshold voltage as seen from the second gate electrode is larger than the threshold voltage as seen from the first gate electrode, and this increase allows the on current and the leak current to decrease.

Further, the speed of the transient response can be increased in proportion as the capacitance of the gate electrode is decreased. It is also permissible to exchange the role of the first gate electrode and the role of the second gate electrode. The gate electrodes may be formed of electrode materials differing in work function. The first method, the second method and the third method of this invention may be used as arbitrarily mixed. Naturally such mixtures of the three methods obtain the same function and effect.

Figure 6:
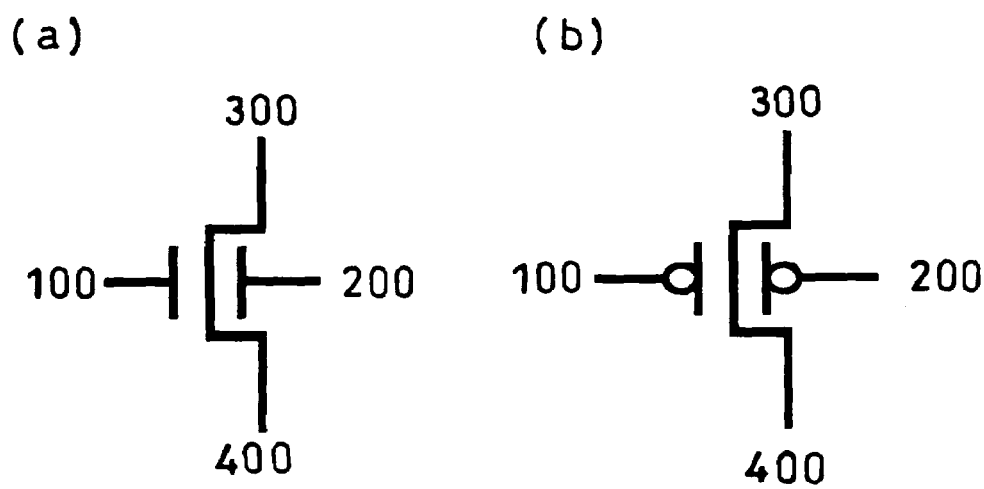
FIG. 6 illustrates graphic symbols used to represent an insulated double gate FET in a circuit diagram, FIG. 6(a) depicting an n channel element and FIG. 6(b) a p channel element.

For a start, FIG. 6 shows the graphic symbols of an insulated double gate FET that are used in the circuit diagram. FIG. 6(a) represents an n channel element and FIG. 6(b) a p channel element. Then, 100 denotes a first gate electrode, 200 a second gate electrode, 300 a drain electrode, and 400 a source electrode.

Figure 7:
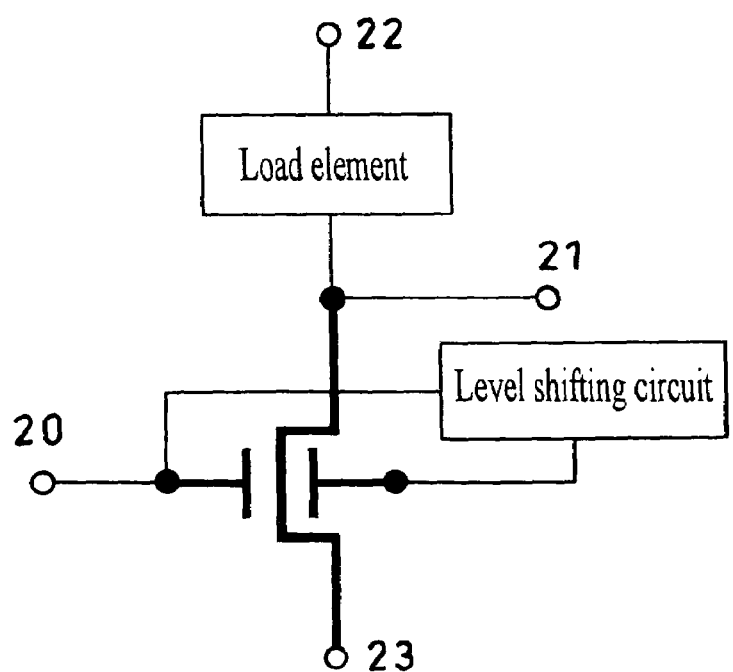
FIG. 7 is an explanatory diagram depicting the method of this invention for application of first gate input when it is utilized for an inverter.

FIG. 7 shows an embodiment of the inverter that utilizes the first method of this invention. In the diagram, reference numeral 20 denotes an input terminal, numeral 21 an output terminal, 22 a drain power source terminal, and 23 a source power source terminal. The signal fed into the input terminal 20 is applied to the first gate electrode, caused to have the potential level shifted in a level shift circuit and applied to the second gate electrode. As load elements, resistors, n channel FETs and p channel FETs are available. As a concrete example of the level shift circuit, a source follower circuit may be cited.

Figure 8:
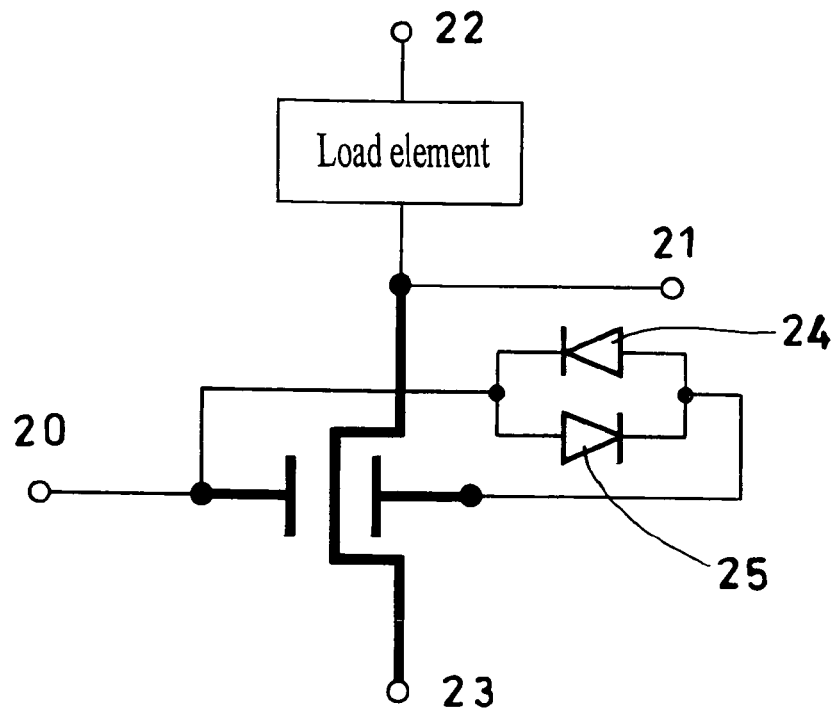
FIG. 8 is an explanatory diagram illustrating one example of the embodiment of a level shift circuit in the inverter shown in FIG. 7.

FIG. 8 depicts the operation of the inverter shown in FIG. 7, wherein diodes 24 and 25 which are set in inverse-parallel connection are used as a level shift circuit and the input signal has the level thereof shifted in the negative direction during the rise time or in the positive direction during the fall time exclusively under the voltage in the forward direction. In the stationary state, since both the gates have substantially identical potentials, the drive current in the ON state and the lead current in the OFF state are similar to those existing in the case of electrically connecting both the gates. The deterioration suffered by the conventional method is absent during the time of transient response and in the stationary state as well. As the diode, the use of a Schottky diode which is devoid of the carrier storage time effect proves advantageous.

Figure 9:
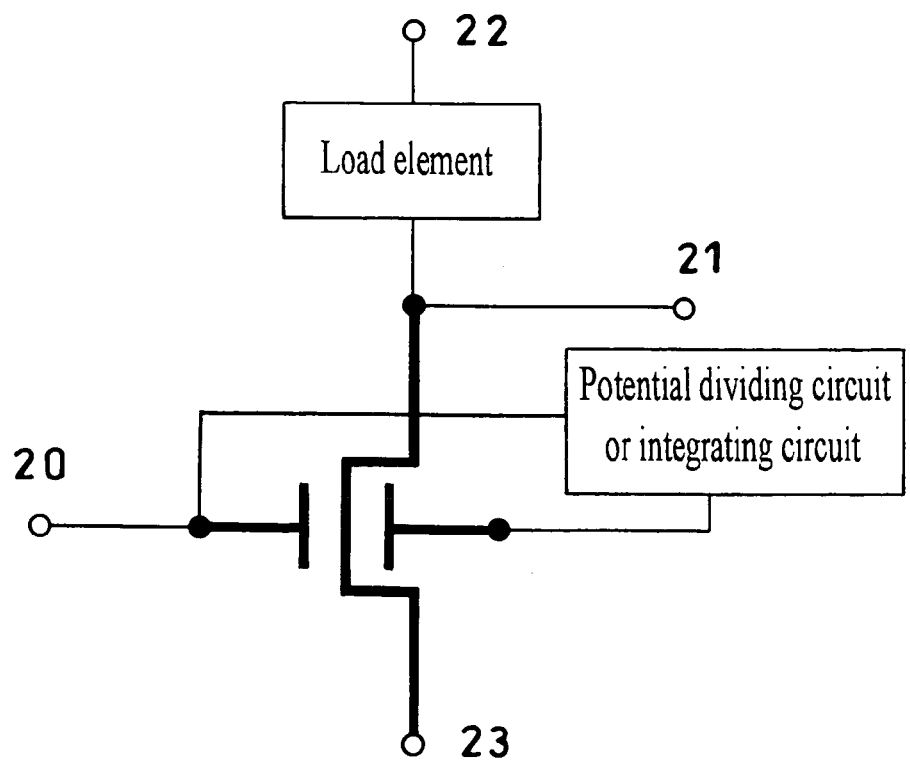
FIG. 9 is an explanatory diagram illustrating the method of this invention for application of the second gate input as utilized in an inverter.

FIG. 9 illustrates an embodiment of the inverter that utilizes the second method of this invention. The input signal of the first gate electrode is fed through a voltage dividing circuit or an integrating circuit and applied to the second gate electrode. To the second gate electrode, therefore, the in-phase signal which has the slower rise or the fall time is applied.

Figure 10:
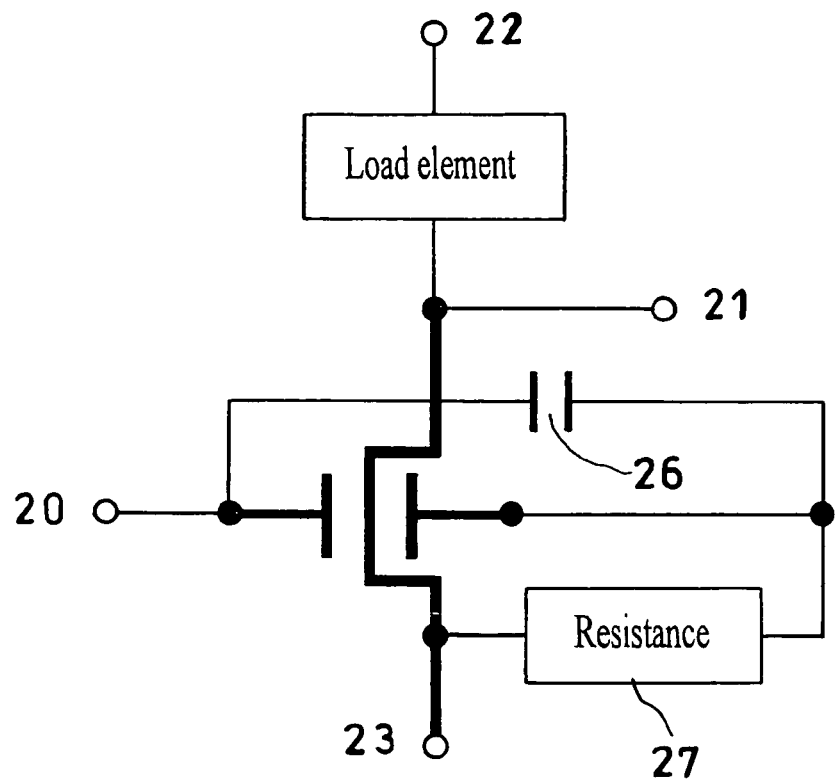
FIG. 10 is an explanatory diagram illustrating one example of the embodiment of a voltage dividing circuit in the inverter shown in FIG. 9.

FIG. 10 illustrates a concrete example of the voltage dividing circuit for the inverter shown in FIG. 9. Both the gate electrodes are connected through a capacitor 26. To the second gate electrode, the signal having the potential thereof divided by the capacitor 26 and the second gate electrode capacitor is ideally applied. Thus, the signal that is slow determined by the ratio of potential divisions of the rise and the fall is applied. The resistance shown in the diagram may be omitted. When it is present, it equals the potential of the source electrode in the stationary state, with the result that the threshold voltage as seen from the first gate electrode will increase and bring only the action of the channel on the first electrode side to allay the leak current and the on current and cut the power consumption. The destination of the connection of the resistance mentioned above does not need to be the source electrode but may be some other point of a constant potential.

Figure 11:
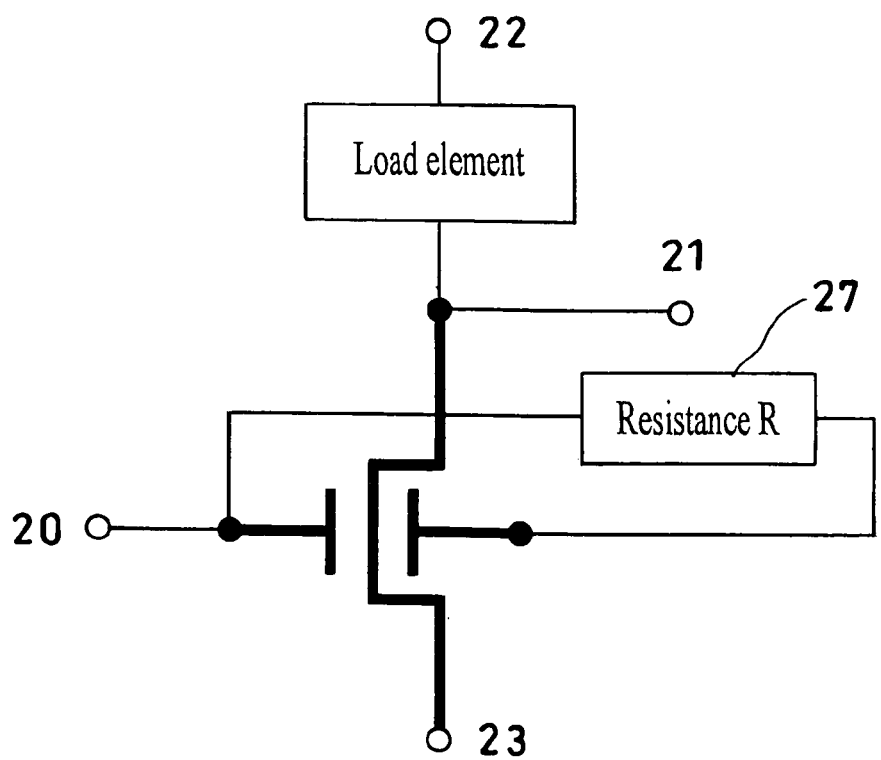
FIG. 11 is an explanatory diagram illustrating one example of the embodiment of an integrating circuit in the inverter shown in FIG. 9.

FIG. 11 illustrates a concrete embodiment of the integrating circuit for the inverter shown in FIG. 9. A resistance R denoted by 27 is laid to interconnect the first gate electrode and the second gate electrode, and this resistance R and the second gate electrode capacitance jointly form an approximate integrating circuit. In this case, both the electrodes have equal potentials in the stationary state.

FIG. 12 illustrates a concrete embodiment of the third method of this invention applied to the inverter circuit of a double rail logic circuit. X1 and X2 each denote an insulated double gate FET, and the second gate electrodes of X1 and X2 are respectively cross-linked to the drain electrodes of X2 and X1. Then, reference numerals 28 and 29 denote signal input terminals and numeral 30 and 31 denote output terminals. As logical values, these terminals emit mutually complementary values. Denoted by 32 is a VDD terminal of the drain power source, and by 33 is a VSS terminal of the source power source. This circuit functions as an inverter circuit for the so-called double rail logic circuit.

The operation will be outlined below. When the input terminals 28 and 29 are at low levels, the output terminals 30 and 31 are allowed to remain in the logical state. That is, one of the output terminals 30 and 31 remains at a high level and the other output terminal continues to remain at a low level. When both the input terminals 28 and 29 are at high levels, X1 and X2 are simultaneously turned on and consequently the output terminals 30 and 31 are simultaneously set to low levels. When a low level is fed simultaneously into the input terminals 28 and 29 from the state mentioned above, one of the output terminals 30 and 31 turns to a high level and the other output terminal to a low level. The question which of them certainly assumes a high level draws no definite answer.

For the sake of altering the state at the output terminal, a high level is fed into the input terminal of the transistor that is at a high level, and a low level is fed into the input terminal of the other transistor. When the output terminal 30 is at a high level and the output terminal 31 is at a low level, for example, a high level is fed into the input terminal 28 and a low level into the input terminal 29. As a result, the X1 is switched from OFF to ON and the X2 from OFF to ON, with the result that the output terminal 30 is changed to a low level and the output terminal 31 to a high level.

Since the second gate electrode of the X1 remains in connection with the output terminal 31 at this time, it changes from the low level to the high level and receives a signal in-phase with the input signal of the input terminal 28. This input is made with a delay that is equivalent to about two transistor stages. It is destined that a signal in-phase with the input signal of the input terminal 29 having a delay equivalent to a transistor stage is fed into the second gate of the X2.

This circuit, only during the change of the state, enables the channels of both the transistors X1 and X2 to assume an active state and, in the stationary state, enables one of the channels which is in the state of low-level output to assume the ON state. Thus, the power consumption can be decreased even when a resistance or an n channel element is used as the load element.

This circuit can be used as a SRAM cell circuit. In this case, cell-selecting transistors are connected respectively to the input terminals 28 and 29 and the same connection is made separately to the output terminals 30 and 31. As a result, the collision between the write and read operations can be avoided because the input to the cell and the outlet from the cell can be extracted from different bit lines. When necessary, the write operation through an output bit line is permissible. The operation as a memory, therefore, can be rendered versatile.

The method according to this invention for the application of a gating electrode signal in an insulated double gate FET is directed toward enabling the threshold of the insulated double gate FET to be controlled arbitrarily and accurately by applying, in response to a first signal fed into a first gate electrode, a second signal that has a same signal-level temporal-change direction as the first signal and (i) has a signal level shifted by a predetermined magnitude or (ii) has a slower or faster rise time or a fall time or (iii) has admitted a predetermined time difference to the second gate electrode.

What is claimed is:

1. A method for the application of a gating signal in an insulated double gate FET, which comprises applying, in response to a first signal fed into a first gate electrode, a second signal that has a same signal-level temporal-change direction and a same signal amplitude as the first signal and has a signal level shifted by a predetermined magnitude to a second gate electrode.

2. A method for the application of a gating signal in an insulated double gate FET, which comprises applying, in response to a first signal fed into a first gate electrode, a second signal that has a same signal-level temporal-change direction and a same signal amplitude as the first signal and has a slower or faster rise time or fall time to a second gate electrode.

3. A method for the application of an insulated gating signal in a double gate FET, which comprises applying, in response to a first signal fed into a first gate electrode, a second signal that has a same signal-level temporal-change direction and a same signal amplitude as the first signal and has a predetermined time difference to a second gate electrode.

4. An integrating circuit furnished with an insulated double gate FET utilizing the method for the application of a gating signal set forth in any one of claims 1 to 3.

* * * * *